United States Patent
Azadet et al.

(10) Patent No.: US 9,363,068 B2
(45) Date of Patent: Jun. 7, 2016

(54) VECTOR PROCESSOR HAVING INSTRUCTION SET WITH SLIDING WINDOW NON-LINEAR CONVOLUTIONAL FUNCTION

(71) Applicant: Intel Corporation, Santa Clara, CA (US)

(72) Inventors: Kameran Azadet, Pasadena, CA (US); Joseph Williams, Holmdel, NJ (US); Meng-Lin Yu, Morganville, NJ (US)

(73) Assignee: INTEL CORPORATION, Santa Clara, CA (US)

( * ) Notice: Subject to any disclaimer, the term of this patent is extended or adjusted under 35 U.S.C. 154(b) by 298 days.

(21) Appl. No.: 14/168,615

(22) Filed: Jan. 30, 2014

(65) Prior Publication Data
US 2014/0317163 A1    Oct. 23, 2014

Related U.S. Application Data

(60) Provisional application No. 61/812,858, filed on Apr. 17, 2013.

(51) Int. Cl.
*G06F 17/15* (2006.01)
*H04L 5/14* (2006.01)
(Continued)

(52) U.S. Cl.
CPC .......... *H04L 5/1461* (2013.01); *G06F 9/30036* (2013.01); *G06F 17/15* (2013.01);
(Continued)

(58) Field of Classification Search
CPC .................................................. H04L 5/1461
USPC ........................................ 708/420, 300–323
See application file for complete search history.

(56) References Cited

U.S. PATENT DOCUMENTS

| 4,673,941 A | 6/1987 | Van Der Mark |
| 5,276,633 A | 1/1994 | Fox et al. |

(Continued)

FOREIGN PATENT DOCUMENTS

| EP | 2256937 A1 | 12/2010 |
| KR | 20050064485 A | 6/2005 |

(Continued)

OTHER PUBLICATIONS

Wegener, A.: "High-Performance Crest Factor Reduction Processor for W-CDMA and OFDM Applications", Radio Frequency Integrated Circuits (RFIC) Symposium, Jun. 2006, 4 pages, IEEE, USA.

(Continued)

*Primary Examiner* — Tan V. Mai

(57) ABSTRACT

A processor is provided having an instruction set with a sliding window non-linear convolution function. A processor obtains a software instruction that performs a non-linear convolution function for a plurality of input delayed signal samples. In response to the software instruction for the non-linear convolution function, the processor generates a weighted sum of two or more of the input delayed signal samples, wherein the weighted sum comprises a plurality of variable coefficients defined as a sum of one or more non-linear functions of a magnitude of the input delayed signal samples; and repeats the generating step for at least one time-shifted version of the input delayed signal samples to compute a plurality of consecutive outputs. The software instruction for the non-linear convolution function is optionally part of an instruction set of the processor. The non-linear convolution function can model a non-linear system with memory, such as a power amplifier model and/or a digital pre-distortion function.

21 Claims, 11 Drawing Sheets

(51) Int. Cl.
*H04L 25/08* (2006.01)
*G06F 17/50* (2006.01)
*H04B 1/62* (2006.01)
*H04L 1/00* (2006.01)
*H04B 1/04* (2006.01)
*G06F 9/30* (2006.01)
*H04L 25/03* (2006.01)
*H04L 27/36* (2006.01)
*H04J 11/00* (2006.01)
*H04B 1/525* (2015.01)

(52) U.S. Cl.
CPC ............ *G06F 17/50* (2013.01); *G06F 17/5009* (2013.01); *H04B 1/0475* (2013.01); *H04B 1/525* (2013.01); *H04B 1/62* (2013.01); *H04J 11/004* (2013.01); *H04L 1/0043* (2013.01); *H04L 25/03012* (2013.01); *H04L 25/03343* (2013.01); *H04L 25/08* (2013.01); *H04L 27/367* (2013.01); *H04L 27/368* (2013.01); *H04B 2001/0425* (2013.01)

(56) References Cited

U.S. PATENT DOCUMENTS

| | | |
|---|---|---|
| 5,381,357 A | 1/1995 | Wedgwood et al. |
| 5,416,845 A | 5/1995 | Qun |
| 5,596,600 A * | 1/1997 | Dimos .................... G01S 19/21 370/208 |
| 5,706,314 A | 1/1998 | Davis et al. |
| 5,896,304 A | 4/1999 | Tiemann |
| 5,949,831 A | 9/1999 | Coker et al. |
| 6,118,832 A | 9/2000 | Mayrargue et al. |
| 6,150,976 A | 11/2000 | Cooley |
| 6,151,682 A | 11/2000 | van der Wal et al. |
| 6,158,027 A | 12/2000 | Bush et al. |
| 6,163,788 A | 12/2000 | Chen et al. |
| 6,446,193 B1 | 9/2002 | Alidina et al. |
| 6,529,925 B1 | 3/2003 | Schenk |
| 6,574,649 B2 | 6/2003 | McGrath |
| 6,580,768 B1 | 6/2003 | Jquette |
| 6,587,514 B1 | 7/2003 | Wright et al. |
| 6,625,235 B1 | 9/2003 | Coker et al. |
| 6,643,814 B1 | 11/2003 | Cideciyan et al. |
| 6,798,843 B1 | 9/2004 | Wright et al. |
| 6,801,086 B1 | 10/2004 | Chandrasekaran |
| 7,039,091 B1 | 5/2006 | Mauer |
| 7,110,477 B2 | 9/2006 | Suissa et al. |
| 7,133,387 B2 | 11/2006 | Nakada |
| 7,167,513 B2 | 1/2007 | Tsui et al. |
| 7,242,725 B2 | 7/2007 | Matsumoto et al. |
| 7,313,373 B1 | 12/2007 | Laskharian et al. |
| 7,336,730 B2 | 2/2008 | Auranen et al. |
| 7,349,375 B2 | 3/2008 | Gerakoulis |
| 7,441,105 B1 | 10/2008 | Metzgen |
| 7,471,739 B1 | 12/2008 | Wright |
| 7,477,634 B1 | 1/2009 | McKown |
| 7,593,492 B1 | 9/2009 | Lande |
| 7,606,292 B1 | 10/2009 | Harris et al. |
| 7,613,228 B2 | 11/2009 | Niedzwiecki |
| 7,656,837 B2 | 2/2010 | Gerakoulis |
| 7,869,482 B2 | 1/2011 | Kubota et al. |
| 7,895,252 B2 | 2/2011 | Sazegari et al. |
| 7,924,942 B2 | 4/2011 | Rexberg |
| 8,331,509 B2 | 12/2012 | Wang et al. |
| 8,516,028 B2 | 8/2013 | Yu |
| 8,583,152 B2 | 11/2013 | Ishii et al. |
| 8,711,988 B2 | 4/2014 | Chen |
| 8,831,133 B2 | 9/2014 | Azadet et al. |
| 8,897,388 B2 | 11/2014 | Molina et al. |
| 8,982,992 B2 | 3/2015 | Azadet et al. |
| 2001/0043582 A1 | 11/2001 | Nakada |
| 2001/0050592 A1 | 12/2001 | Wright et al. |
| 2001/0050926 A1 | 12/2001 | Kumar |
| 2002/0057735 A1 | 5/2002 | Piirainen |
| 2002/0062436 A1 | 5/2002 | Van Hook et al. |
| 2002/0101835 A1 | 8/2002 | Gerakoulis |
| 2003/0112904 A1 | 6/2003 | Fuller et al. |
| 2003/0152165 A1 | 8/2003 | Kondo et al. |
| 2003/0223505 A1 | 12/2003 | Verbin et al. |
| 2004/0052314 A1 | 3/2004 | Copeland |
| 2004/0180679 A1 | 9/2004 | Porter |
| 2004/0202137 A1 | 10/2004 | Gerakoulis |
| 2004/0248516 A1 | 12/2004 | Demir et al. |
| 2005/0001675 A1 | 1/2005 | Saed |
| 2005/0036575 A1 | 2/2005 | Kuchi et al. |
| 2005/0108002 A1 | 5/2005 | Nagai et al. |
| 2006/0029149 A1 | 2/2006 | Kim et al. |
| 2006/0109938 A1 | 5/2006 | Challa et al. |
| 2006/0176969 A1 | 8/2006 | Trivedi |
| 2006/0198466 A1 | 9/2006 | Wright et al. |
| 2006/0240786 A1 | 10/2006 | Liu |
| 2007/0005674 A1 | 1/2007 | Sazegari et al. |
| 2007/0087770 A1 | 4/2007 | Gan |
| 2007/0189402 A1 | 8/2007 | Yang |
| 2008/0019422 A1 | 1/2008 | Smith et al. |
| 2008/0027720 A1 | 1/2008 | Kondo et al. |
| 2008/0030388 A1 | 2/2008 | Muck et al. |
| 2008/0056403 A1 | 3/2008 | Wilson |
| 2008/0074155 A1 | 3/2008 | Jaklitsch |
| 2008/0095265 A1 | 4/2008 | Cai et al. |
| 2008/0107046 A1 | 5/2008 | Kangasmaa et al. |
| 2008/0123770 A1 | 5/2008 | Copeland |
| 2008/0144539 A1 | 6/2008 | Sperlich et al. |
| 2008/0187057 A1 | 8/2008 | Qu |
| 2008/0192860 A1 | 8/2008 | Harwood et al. |
| 2008/0219220 A1 | 9/2008 | Gerakoulis |
| 2008/0247487 A1 | 10/2008 | Cai et al. |
| 2008/0267261 A1 | 10/2008 | Wang et al. |
| 2008/0316076 A1 | 12/2008 | Dent et al. |
| 2009/0006514 A1 | 1/2009 | Kountouris |
| 2009/0029664 A1 | 1/2009 | Batruni |
| 2009/0079627 A1 | 3/2009 | Sun et al. |
| 2009/0116576 A1 | 5/2009 | Dowling |
| 2009/0164542 A1 | 6/2009 | Wu et al. |
| 2009/0225899 A1 | 9/2009 | Dent |
| 2009/0245406 A1 | 10/2009 | Moffatt et al. |
| 2009/0256632 A1 | 10/2009 | Klingberg et al. |
| 2009/0257421 A1 | 10/2009 | Nakashima et al. |
| 2009/0285335 A1 | 11/2009 | Hoshuyama |
| 2010/0027592 A1 | 2/2010 | Arviv et al. |
| 2010/0067511 A1 | 3/2010 | Peters |
| 2010/0098139 A1 | 4/2010 | Braithwaite |
| 2010/0124257 A1 | 5/2010 | Yahya |
| 2010/0138463 A1 | 6/2010 | Azadet et al. |
| 2010/0138464 A1 | 6/2010 | Azadet et al. |
| 2010/0138465 A1 | 6/2010 | Azadet et al. |
| 2010/0138468 A1 | 6/2010 | Azadet et al. |
| 2010/0144333 A1 | 6/2010 | Kiasaleh et al. |
| 2010/0158051 A1 | 6/2010 | Hadzic et al. |
| 2010/0198893 A1 | 8/2010 | Azadet et al. |
| 2010/0198894 A1 | 8/2010 | Azadet et al. |
| 2010/0225390 A1 | 9/2010 | Brown et al. |
| 2010/0246714 A1 | 9/2010 | Yang et al. |
| 2010/0255867 A1 | 10/2010 | Ishii et al. |
| 2010/0273427 A1 | 10/2010 | Mergen et al. |
| 2010/0316112 A1 | 12/2010 | Huang et al. |
| 2011/0002249 A1 | 1/2011 | Gerakoulis |
| 2011/0007907 A1 | 1/2011 | Park et al. |
| 2011/0019724 A1 | 1/2011 | Agazzi |
| 2011/0025414 A1 | 2/2011 | Wolf et al. |
| 2011/0055303 A1 | 3/2011 | Slavin |
| 2011/0059710 A1 | 3/2011 | Cai et al. |
| 2011/0080902 A1 | 4/2011 | Jang |
| 2011/0096824 A1 | 4/2011 | Agazzi et al. |
| 2011/0170421 A1 | 7/2011 | Gerakoulis |
| 2011/0255011 A1 | 10/2011 | Gu et al. |
| 2011/0268167 A1 | 11/2011 | Sundström |
| 2011/0302230 A1 | 12/2011 | Ekstrand |
| 2012/0036174 A1 | 2/2012 | Yu |
| 2012/0087406 A1 | 4/2012 | Lim et al. |
| 2012/0093209 A1 | 4/2012 | Schmidt et al. |
| 2012/0106614 A1 | 5/2012 | Kim et al. |

(56) References Cited

U.S. PATENT DOCUMENTS

| | | |
|---|---|---|
| 2012/0188994 A1 | 7/2012 | Palanki et al. |
| 2012/0280840 A1 | 11/2012 | Kyeong et al. |
| 2012/0295657 A1 | 11/2012 | Okazaki |
| 2013/0007082 A1 | 1/2013 | Elenes |
| 2013/0022157 A1 | 1/2013 | Hollevoet et al. |
| 2013/0044794 A1 | 2/2013 | Wenzel et al. |
| 2013/0070867 A1 | 3/2013 | To et al. |
| 2013/0114652 A1 | 5/2013 | Molina et al. |
| 2013/0114761 A1 | 5/2013 | Azadet et al. |
| 2013/0114762 A1 | 5/2013 | Azadet et al. |
| 2013/0117342 A1 | 5/2013 | Azadet et al. |
| 2013/0195007 A1 | 8/2013 | Mazurenko et al. |
| 2014/0016626 A1 | 1/2014 | Dai et al. |
| 2014/0064417 A1 | 3/2014 | Azadet |
| 2014/0072073 A1 | 3/2014 | Azadet et al. |
| 2014/0075162 A1 | 3/2014 | Azadet et al. |
| 2014/0086356 A1 | 3/2014 | Azadet et al. |
| 2014/0086361 A1 | 3/2014 | Azadet et al. |
| 2014/0086367 A1 | 3/2014 | Azadet et al. |
| 2014/0108477 A1 | 4/2014 | Azadet et al. |
| 2014/0313946 A1 | 10/2014 | Azadet |
| 2014/0314176 A1 | 10/2014 | Azadet |
| 2014/0314181 A1 | 10/2014 | Azadet |
| 2014/0314182 A1 | 10/2014 | Azadet |
| 2014/0316752 A1 | 10/2014 | Azadet |
| 2014/0317376 A1 | 10/2014 | Azadet |

FOREIGN PATENT DOCUMENTS

| | | |
|---|---|---|
| WO | 2007010331 A1 | 1/2007 |
| WO | 2007104362 A1 | 9/2007 |
| WO | 2008057584 A2 | 5/2008 |
| WO | 2011/058843 A1 | 5/2011 |
| WO | 2011/101233 A1 | 8/2011 |
| WO | 2013/063434 A1 | 5/2013 |
| WO | 2013/063440 A1 | 5/2013 |
| WO | 2013/063443 A1 | 5/2013 |
| WO | 2013/063447 A1 | 5/2013 |
| WO | 2013/063450 A1 | 5/2013 |
| WO | 2013/066756 A1 | 5/2013 |

OTHER PUBLICATIONS

Gopalan, R. et al.: "An Optimization Approach to Single-Bit Quantization", IEEE Transactions on Circuits and Systems I: Regular Papers, Dec. 2009, pp. 2655-2668, vol. 56, Issue 12, IEEE, USA.
Gopalan, R. et al.: "On an optimum algorithm for waveform synthesis and its applications to digital transmitters", Wireless Communications and Networking Conference, Mar. 2005, pp. 1108-1113, vol. 2, IEEE, USA.
Venkatamaran, J. et al.: "An All-Digital Transmitter with a 1-Bit DAC", IEEE Transactions on Communications, Oct. 2007, pp. 1951-1962, vol. 55, Issue 10, IEEE, USA.
European Search Report received for the corresponding EP application No. EP 12 84 3913.0, mailed on Jul. 9, 2015, 7 pages.
European Search Report received for the corresponding EP application No. EP 12 84 2850.5, mailed on Jun. 25, 2015, 5 pages.
Li, "FIR Filtering Using Vector Transformation and Convolution Processor", 1990, IEEE, pp. 1223-1226.
Gopalan et al., "An Optimization Approach to Single-Bit Quantization", IEEE Transactions on Circuits and Systems—I: Regular Papers, vol. 56, No. 12, Dec. 2009, pp. 2655-2668.
Venkataraman et al., "An All-Digital Transmitter with a 1-Bit DAC", IEEE Transactions on Communications, vol. 55, No. 10, Oct. 2007, pp. 1951-1962.
Office action received for U.S. Appl. No. 13/661,295, mailed on Feb. 28, 2014, 8 pages.
Notice of Allowance received for U.S. Appl. No. 13/661,295, mailed on Aug. 4, 2014, 7 pages.
Office action received for U.S. Appl. No. 13/661,351, mailed on May 23, 2014, 32 pages.
Office action received for U.S. Appl. No. 13/661,351, mailed on Nov. 14, 2014, 28 pages.
Office action received for U.S. Appl. No. 13/661,351, mailed on Mar. 26, 2015, 39 pages.
Office action received for U.S. Appl. No. 13/661,355, mailed on Jun. 4, 2015, 17 pages.
Office action received for U.S. Appl. No. 13/661,355, mailed on Feb. 6, 2015, 14 pages.
Office action received for U.S. Appl. No. 13/661,355, mailed on Sep. 25, 2014, 12 pages.
Office action received for U.S. Appl. No. 13/661,357, mailed on Oct. 18, 2013, 7 pages.
Notice of Allowance received for U.S. Appl. No. 13/661,357, mailed on May 13, 2014, 6 pages.
Office action received for U.S. Appl. No. 13/701,369, mailed on Jun. 24, 2014, 16 pages.
Office action received for U.S. Appl. No. 13/701,374, mailed on May 29, 2015, 7 pages.
Office action received for U.S. Appl. No. 13/701,384, mailed on Dec. 31, 2014, 21 pages.
Office action received for U.S. Appl. No. 13/701,415, mailed on Aug. 1, 2014, 11 pages.
Notice of Allowance received for U.S. Appl. No. 13/701,415, mailed on Nov. 20, 2014, 5 pages.
Office action received for U.S. Appl. No. 14/090,555, mailed on Nov. 17, 2014, 20 pages.
Office action received for U.S. Appl. No. 13/701,384, mailed on Jul. 16, 2015, 21 pages.
Office action received for U.S. Appl. No. 12/849,142, mailed on Jan. 4, 2015, 6 pages.
Notice of Allowance received for U.S. Appl. No. 12/849,142, mailed on Apr. 26, 2013, 6 pages.
Notice of Allowance received for U.S. Appl. No. 14/090,555, mailed on Aug. 12, 2014, 8 pages.
Office action received for U.S. Appl. No. 13/701,376, mailed on Jul. 22, 2015, 9 pages.
Office action received for U.S. Appl. No. 13/701,397, mailed on Jul. 30, 2015, 15 pages.
Office action received for U.S. Appl. No. 13/566,146, mailed on Jan. 29, 2015, 6 pages.
Notice of Allowance received for U.S. Appl. No. 13/566,146, mailed on Jun. 1, 2015, 13 pages.
Supplementary European Search Report for EP Patent Application No. EP12846556, mailed on Jun. 24, 2015, 6 pages.
Supplementary European Search Report for EP Patent Application No. EP12843512, mailed on Jun. 2, 2015, 6 pages.
Supplementary European Search Report for EP Patent Application No. EP12842850, mailed on Jun. 25, 2015, 4 pages.
Supplementary European Search Report for EP Patent Application No. EP12843913, mailed on Jul. 9, 2015, 6 pages.
Office action received for U.S. Appl. No. 14/230,622, mailed on Apr. 14, 2015, 22 pages.
Notice of Allowance received for U.S. Appl. No. 14/230,622, mailed on Aug. 28, 2015, 13 pages.
Final Office Action received for U.S. Appl. No. 13/661,351, dated Sep. 10, 2015, 15 pages of office action.
Non-final Office Action received for U.S. Appl. No. 13/701,374, dated Aug. 24, 2015, 8 pages of office action.
Notice of Allowance received for U.S. Appl. No. 14/090,555, dated Aug. 12, 2015, 8 pages.
Notice of Allowance received for U.S. Appl. No. 13/566,146, dated Feb. 12, 2016, 5 pages.

\* cited by examiner

FIG. 3

```
for i=0;i<256;i+=16
        {
        Load 16 input samples (16b/16b complex)
        Compute |x|^2 for 16 samples
        Store 16 squared samples x2 (16b/16b complex)
        }
1 cycle for 16 samples, load/mult/store pipelined in parallel for m=0;m<20;m++
        {
        Load 128 coefficients for piecewise polynomial fm
        for i=0;i<256;i+=16
                {
                Load 16 input samples at offset u(m)
                Load 16 squared samples x2 at offset v(m)
                Compute nonlinear function fm(x2(v(m)))
                Multiply/accumulate x(u(m))*fm
                }
        }
```

- 310 (first block)
- 320 (second block start)
- 330 (inner loop)

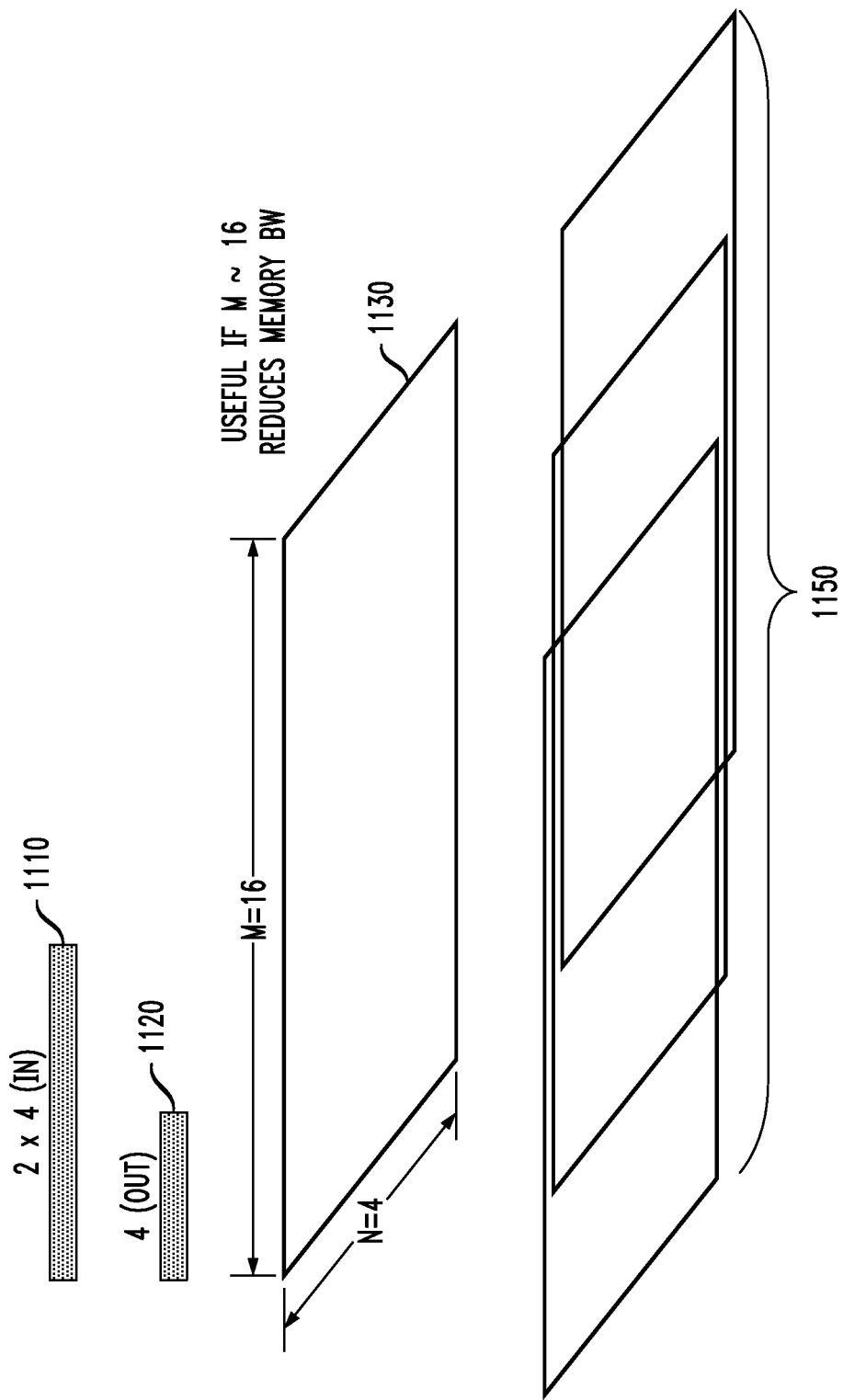

US 9,363,068 B2

VECTOR PROCESSOR HAVING INSTRUCTION SET WITH SLIDING WINDOW NON-LINEAR CONVOLUTIONAL FUNCTION

CROSS-REFERENCE TO RELATED APPLICATIONS

The present application claims priority to U.S. Patent Provisional Application Ser. No. 61/812,858, filed Apr. 17, 2013, entitled "Digital Front End (DFE) Signal Processing," incorporated by reference herein.

The present application is related to PCT Patent Application No. PCT/US12/62179, filed Oct. 26, 2012, entitled "Software Digital Front End (SoftDFE) Signal Processing;" PCT Patent Application No. PCT/US12/62182, filed Oct. 26, 2012, entitled "Vector Processor Having Instruction Set With Vector Convolution Function For FIR Filtering;" PCT Patent Application No. PCT/US12/62186, filed Oct. 26, 2012, entitled "Processor Having Instruction Set with User-Defined Non-Linear Functions for Digital Pre-Distortion (DPD) and Other Non-Linear Applications," and U.S. patent application Ser. No. 12/849,142, filed Aug. 3, 2010, entitled "System and Method for Providing Memory Bandwidth Efficient Correlation Acceleration," each incorporated by reference herein.

FIELD OF THE INVENTION

The present invention is related to digital signal processing techniques and, more particularly, to techniques for digital processing of non-linear functions.

BACKGROUND OF THE INVENTION

Digital signal processors (DSPs) are special-purpose processors utilized for digital processing. Digital signal processing algorithms typically require a large number of mathematical operations to be performed quickly and efficiently on a set of data. DSPs thus often incorporate specialized hardware to perform software operations that are often required for math-intensive processing applications, such as addition, multiplication, multiply-accumulate (MAC), and shift-accumulate. Such basic operations can be efficiently carried out utilizing specialized high-speed multipliers and accumulators.

A vector processor implements an instruction set containing instructions that operate on vectors (i.e., one-dimensional arrays of data). The scalar DSPs, on the other hand, have instructions that operate on single data items. Vector processors offer improved performance on certain workloads.

PCT Patent Application No. PCT/US12/62186, filed Oct. 26, 2012, entitled "Processor Having Instruction Set with User-Defined Non-Linear Functions for Digital Pre-Distortion (DPD) and Other Non-Linear Applications," discloses a processor that supports non-linear functions that include one or more parameters specified by a user, such as filter coefficient values or values from a look-up table (LUT). While the disclosed techniques have significantly improved the performance of software implementations of DPD and other non-linear applications, a need remains for digital processors, such as DSPs and vector processors, having an instruction set that supports a sliding window non-linear convolution function.

SUMMARY OF THE INVENTION

Generally, a processor is provided having an instruction set with a sliding window non-linear convolution function. According to one aspect of the invention, a processor obtains at least one software instruction that performs at least one non-linear convolution function for a plurality of input delayed signal samples. In response to the at least one software instruction for the at least one non-linear convolution function, the processor performs the following steps: generating a weighted sum of two or more of the input delayed signal samples, wherein the weighted sum comprises a plurality of variable coefficients defined as a sum of one or more non-linear functions of a magnitude of the input delayed signal samples; and repeating the generating step for at least one time-shifted version of the input delayed signal samples to compute a plurality of consecutive outputs, wherein the at least one software instruction for the at least one non-linear convolution function is part of an instruction set of the processor.

The variable coefficients defined by a non-linear function of a magnitude of the input delayed signal samples are optionally implemented using one or more look-up tables. The non-linear convolution function can model a non-linear system with memory, such as a power amplifier model and/or a digital pre-distortion function. The non-linear convolution function is optionally implemented using one or more look-up tables having linear and/or polynomial interpolation.

A more complete understanding of the present invention, as well as further features and advantages of the present invention, will be obtained by reference to the following detailed description and drawings.

BRIEF DESCRIPTION OF THE DRAWINGS

FIG. 3 illustrates exemplary pseudo code to implement a DPD function in software on a vector processor of 16 component vectors using a user-defined non-linear instruction $f_{m,i}$;

FIG. 11 illustrates an alternate asymmetric embodiment of the invention, where an exemplary input is processed by an asymmetric array of functional units using a plurality of overlapping windows and the output comprises a vector.

DETAILED DESCRIPTION

Aspects of the present invention provide digital processors, such as DSPs and vector processors, having an instruction set that supports a sliding window non-linear convolution function. As used herein, the term "digital processor" shall be a processor that executes instructions in program code, such as a DSP or a vector processor. It is further noted that the disclosed complex exponential function can be applied for values of x that are scalar or vector inputs. The present invention can be applied, for example, in handsets, base stations and other network elements.

Figure 1:
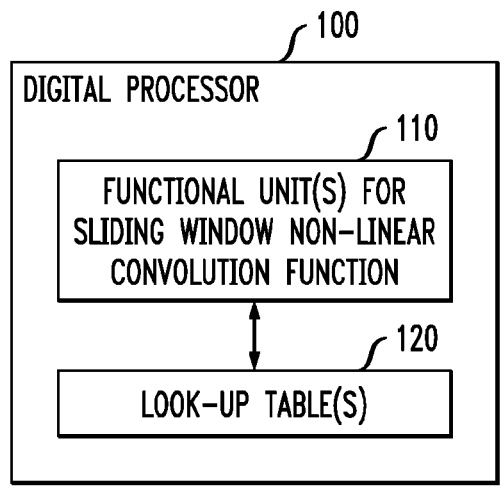
FIG. 1 is a schematic block diagram of an exemplary digital processor that incorporates features of the present invention.

FIG. 1 is a schematic block diagram of an exemplary digital processor 100 that incorporates features of the present invention. The exemplary digital processor 100 can be implemented as a DSP or a vector processor. As shown in FIG. 1, the exemplary digital processor 100 includes one or more functional units 110 for a sliding window non-linear convolution function. In addition, the digital processor 100 comprises one or more look-up tables 120 that store, for example, discrete points that define the non-linear function.

Generally, if the digital processor 100 is processing software code that includes a predefined instruction keyword corresponding to a sliding window non-linear convolution function and any appropriate operands for the function, the instruction decoder must trigger the appropriate functional units 110 that are required to process the instruction. It is noted that a functional unit 110 can be shared by more than one instruction.

Generally, aspects of the present invention extend conventional digital processors to provide an enhanced instruction set that supports sliding window non-linear convolution functions. The digital processor 100 in accordance with aspects of the present invention receives at least one software instruction that performs a non-linear convolution function for a plurality of input delayed signal samples. In response to the software instruction for the non-linear convolution function, the digital processor 100 generates a weighted sum of two or more of the input delayed signal samples. The weighted sum comprises a plurality of variable coefficients defined as a sum of one or more non-linear functions of a magnitude of the input delayed signal samples. The weighted sum is calculated for at least one time-shifted version of the input delayed signal samples to compute a plurality of consecutive outputs.

The non-linear convolution function can be expressed as follows:

$$y(n+k) = \sum_{l=0}^{L-1} \sum_{m=0}^{M-1} f_{l,m}(|x(n+k-l)|)x(n+k-m), \quad (1)$$

$0 \leq k \leq N-1$.

The variables in equation (1) are defined further below in conjunction with FIG. 5. A special case of the non-linear convolution function can be expressed as follows:

$$y(n+k) = \sum_{l=0}^{M-1} \sum_{m=0}^{M-1} f_{l,m}(|x(n+k-l)|)x(n+k-m), \quad (2)$$

$0 \leq k \leq N-1$.

Thus, the non-linear convolution function computes multiple non-linear outputs, recognizing data re-use due to a sliding window type of operation. In the above sums, L×M LUTs need to be processed. In practice, if the L×M number exceeds the capability of the processor instruction, only a subset (e.g., 8) are processed for each cycle. To produce the complete sum, additional passes are performed on the input samples block and accumulated over previous results to produce the final values of the output signal, y.

The disclosed sliding window non-linear convolution functions may be employed, for example, for digital pre-distortion (DPD) and other non-linear signal processing.

As indicated above, PCT Patent Application No. PCT/US12/62186, filed Oct. 26, 2012, entitled "Processor Having Instruction Set with User-Defined Non-Linear Functions for Digital Pre-Distortion (DPD) and Other Non-Linear Applications," discloses a processor that supports non-linear functions that include one or more parameters specified by a user, such as filter coefficient values or values from a look-up table. Each execution of the user-specified non-linear function produces a single output.

In addition, PCT Patent Application No. PCT/US12/62182, filed Oct. 26, 2012, entitled "Vector Processor Having Instruction Set With Vector Convolution Function For FIR Filtering" discloses a vector processor having an instruction set with a vector convolution function. Among other benefits, the disclosed vector processor computes multiple outputs in a single cycle. Generally, a disclosed vector convolution function computes the convolution of N-bit complex data (N/2-bit real and N/2-bit imaginary) and complex antipodal data (e.g., coefficients). The exemplary vector convolution function receives an input vector of N1+N2−1 input samples and processes time shifted versions of N1 samples of the input vector N1 and fixed coefficients, and for each time shifted-version (each time lag) produces an FIR output value. An output vector is comprised of the N2 output values.

Aspects of the present invention recognize that the time shifted versions of input samples can be stored in a register and re-used multiple times in a single cycle, rather than reloading the input values from memory multiple times. According to one aspect of the invention, multiple consecutive outputs are computed using the time shifted input samples. According to another aspect of the invention, the coefficients are non-linear functions of the input magnitude and can be implemented, for example, using look-up tables.

Figure 2:
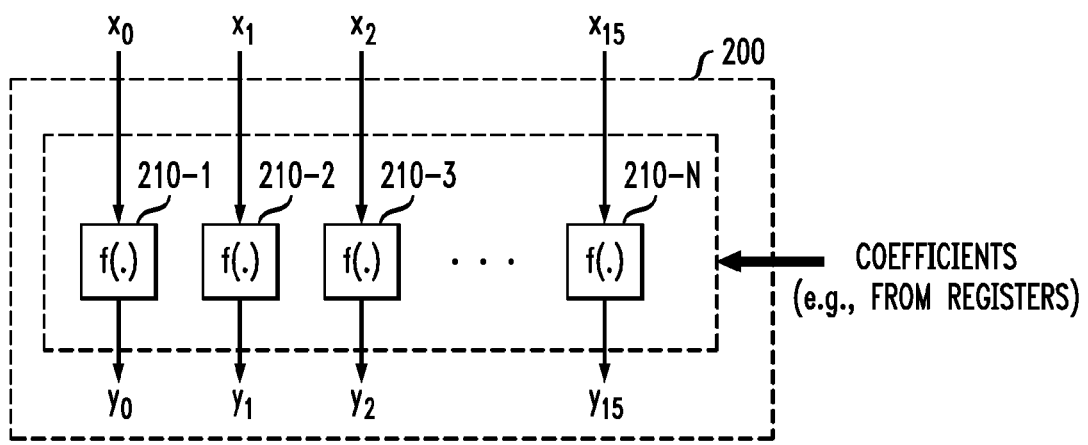
FIG. 2 is a schematic block diagram of an exemplary vector-based digital processor that processes one or more numbers simultaneously in accordance with an embodiment of the present invention.

FIG. 2 is a schematic block diagram of an exemplary vector-based digital processor 200 that processes one or more numbers simultaneously in accordance with an embodiment of the present invention. Generally, the vector-based implementation of FIG. 2 increases performance by reducing a number of operations per second, relative to a scalar implementation, by performing more operations concurrently using less instructions (e.g., MAC and other non-linear functions). Thus, the vector-based digital processor 200 contains plural functional units 210-1 through 210-N for user-defined non-linear functions f(.). For example, a dual digital processor 200 contains two functional units 210-1 and 210-2 that are capable of performing two independent user-defined non-linear function operations concurrently.

Generally, the vector-based digital processor 200 processes a vector of inputs x and generates a vector of outputs, y. The exemplary vector-based digital processor 200 is shown for a 16-way vector processor instruction. In one exemplary implementation having 32 segments, for coefficients represented using four cubic polynomial approximation coefficients, in the look-up table there are 128 complex entries (16 bit complex and 16 bit real). In a further variation having 128 segments, and one coefficient per segment, there are 128 complex coefficients for linear interpolation (16 bit complex and 16 bit real).

The exemplary vector-based digital processor 200 thus performs 16 such non-linear operations according to the following equation, and linearly combines them in a single cycle at each call of the vector non-linear instruction computing as an example the non-linear polynomial function:

$$f(x) = \sum_{k=0}^{19} a_k x^k$$

It is noted that in the more general case, different functions may be applied to each component of the vector data of the vector processor.

As shown in FIG. 2, the functional units 210 receive a user-specification, such as the look-up tables or coefficients, from memory for storage in a register.

Non-Linear Filter Implementation of Digital Pre-Distorter

A digital pre-distorter can be implemented as a non-linear filter using a Volterra series model of non-linear systems. The Volterra series is a model for non-linear behavior in a similar manner to a Taylor series. The Volterra series differs from the Taylor series in its ability to capture "memory" effects. The Taylor series can be used to approximate the response of a non-linear system to a given input if the output of this system depends strictly on the input at that particular time. In the Volterra series, the output of the non-linear system depends on the input to the system at other times. Thus, the Volterra series allows the "memory" effect of devices to be captured.

Generally, a causal system with memory can be expressed as:

$$y(t) = \int_{-\infty}^{\infty} h(\tau) x(t-\tau) d\tau$$

In addition, a weakly non-linear system without memory can be modeled using a polynomial expression:

$$y(t) = \sum_{k=1}^{\infty} a_k [x(t)]^k$$

The Volterra series can be considered as a combination of the two:

$$y(t) = \sum_{k=1}^{K} y_k(t)$$

$$y(t) = \int_{-\infty}^{\infty} \ldots \int_{-\infty}^{\infty} h(\tau_1, \ldots, \tau_k) x(t-\tau) d\tau$$

In the discrete domain, the Volterra Series can be expressed as follows:

$$y(n) = \sum_{k=1}^{K} y_k(n)$$

$$y(n) = \sum_{m_1=0}^{M-1} \ldots \sum_{m_k=0}^{M-1} h_k(m_1, \ldots, m_k) \Pi_{l=1}^{k} x(n-m_l)$$

The complexity of a Volterra series can grow exponentially making its use impractical in many common applications, such as DPD. Thus, a number of simplified models for non-linear systems have been proposed. For example, a memory polynomial is a commonly used model:

$$y_{MP}(n) = \sum_{k=1}^{K} \sum_{m=0}^{M-1} h_k(m, \ldots m) x^k(n-m)$$

$$= \sum_{k=0}^{K-1} \sum_{m=0}^{M-1} h_{km} x(n-m) |x(n-m)|^k$$

Another simplified model referred to as a Generalized Memory Polynomial Model, can be expressed as follows (where M indicates the memory depth and K indicates the polynomial order):

$$y(n) = \sum_{m=0}^{M-1} \sum_{l=0}^{M-1} \sum_{k=0}^{K-1} h_{k,m,l} |x(n-l)|^k x(n-m)$$

$$y(n) = \sum_{m=0}^{M-1} \sum_{l=0}^{M-1} x(n-m) \sum_{k=0}^{K-1} h_{k,m,l} |x(n-l)|^k$$

An equivalent expression of the Generalized Memory Polynomial with cross-products, can be expressed as follows:

$$y(n) = \sum_{m=0}^{M-1} \sum_{l=0}^{M-1} x(n-m) \cdot f_{m,l}(|x(n-l)|) \quad (3)$$

where:

$$f_{m,l}(|x(n-l)|) = \sum_{k=0}^{K-1} h_{k,m,l} |x(n-l)|^k \quad (4)$$

where f(x) is a non-linear function having one or more user-specified parameters assumed to be accelerated in accordance with an aspect of the invention using the user-defined non-linear instruction vec_nl, discussed below. It is noted that other basis functions other than $x^k$ for non-linear decomposition are possible.

As discussed hereinafter, the user-defined non-linear instruction $f_{m,l}$ can be processed, for example, by a vector processor, such as the vector processor of FIG. 2. The $f_{m,l}$ is an m×l array of non-linear functions. Each non-linear function can have a user-specified parameter, such a look-up table or coefficients. The look-up table can be a polynomial approximation of the user-defined non-linear instruction $f_{m,l}$. In one exemplary embodiment, the look-up table for each user-defined non-linear instruction $f_{m,l}$ in the m×l array can be stored in memory and loaded into a register when the instruction is processed by the vector processor 200 (or even directly loaded from memory into the non-linear convolution functional unit). The input samples can then be evaluated on the individual non-linear instruction $f_{m,l}$ in the m×l array.

FIG. 3 illustrates exemplary pseudo code 300 to implement a DPD function in software on a vector processor of 16 component vectors using a user-defined non-linear instruction $f_{m,l}$ of equation (3). The exemplary pseudo code 300 comprises a first portion 310 to compute a magnitude of the input x. In line 320, the look-up table for an individual non-linear instruction $f_{m,l}$ in the m×l array can be loaded into a register. Thereafter, the exemplary pseudo code 300 comprises a portion 330 to implement equation (3) (e.g., input samples, perform a square operation on the samples, compute the non-linear function and then multiply accumulate the result).

Figure 4A:
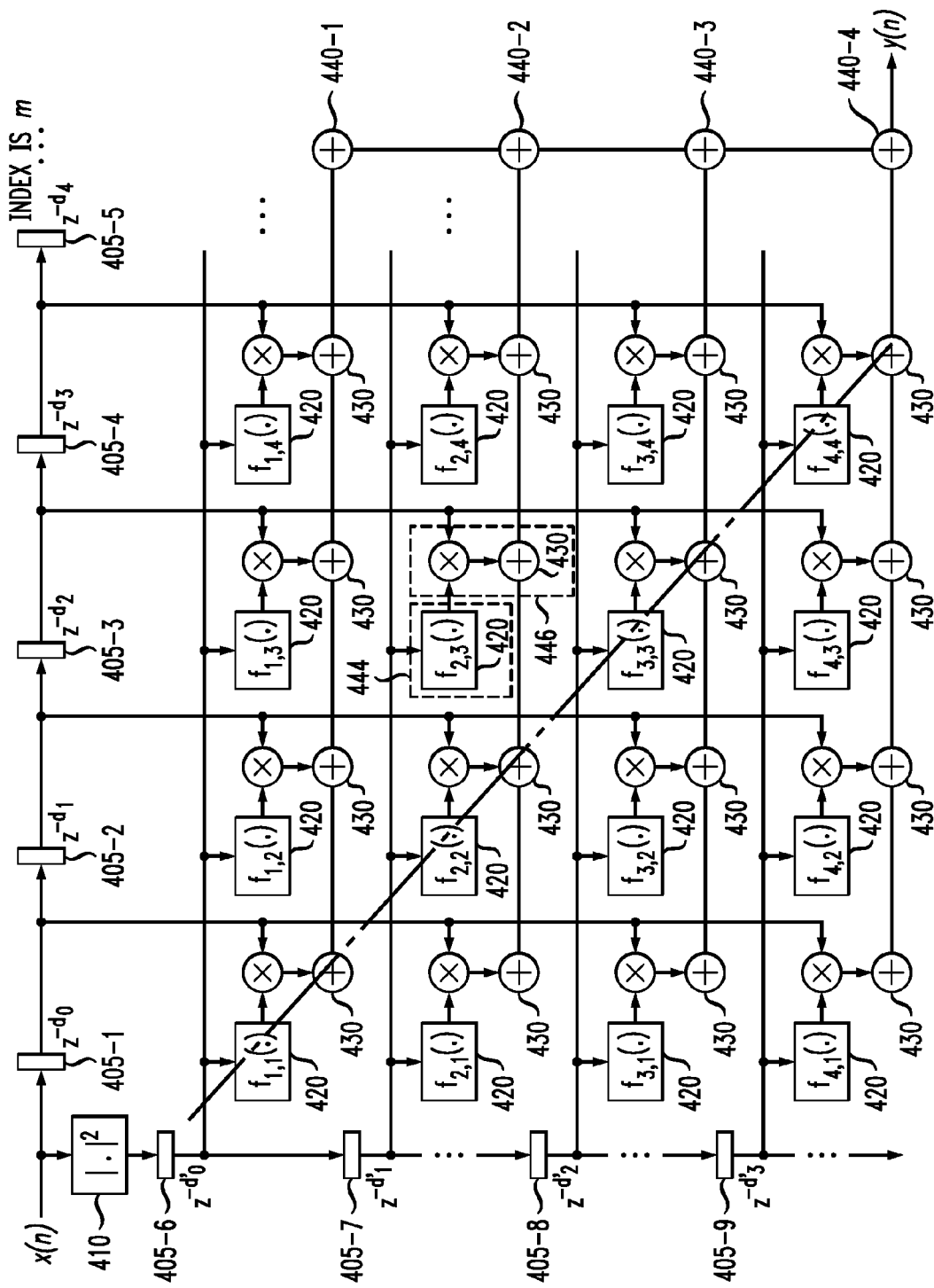
FIGS. 4A and 4B are graphical illustrations of exemplary functional block diagrams.

FIG. 4A is a graphical illustration of an exemplary functional block diagram 400 that implements equation (3). In the exemplary embodiments described herein, $|x|^{2k}$ is used instead of $|x|^k$. As shown in FIG. 4A, the exemplary circuit 400 comprises a plurality of delay elements, such as delay elements 405-1 through 405-5 to generate the x(n−m) term of equation (3) and delay elements 405-6 through 405-9 to generate the $|x(n-l)|^2$ term of equation (4) by delaying the output of a squaring operation 410. In addition, the exemplary functional block diagram 400 comprises an array of functional units 420-1,1 through 420-4,4 that receive the appropriate $|x(n-l)|^2$ term and implement equation (4). The exemplary functional block diagram 400 also comprises a plurality of multipliers (x) that receive the appropriate x(n−m) term and multiply it with the output of the corresponding m,l functional unit 420. The outputs of the multiplication in each row are added by adders (+) 430 and the outputs of each adder 430 in a given row are summed by a corresponding adder 440 to generate the output y(n).

FIG. 4A also illustrates a diagonal line 442 that is discussed further below in conjunction with FIGS. 6-8.

Figure 4B:
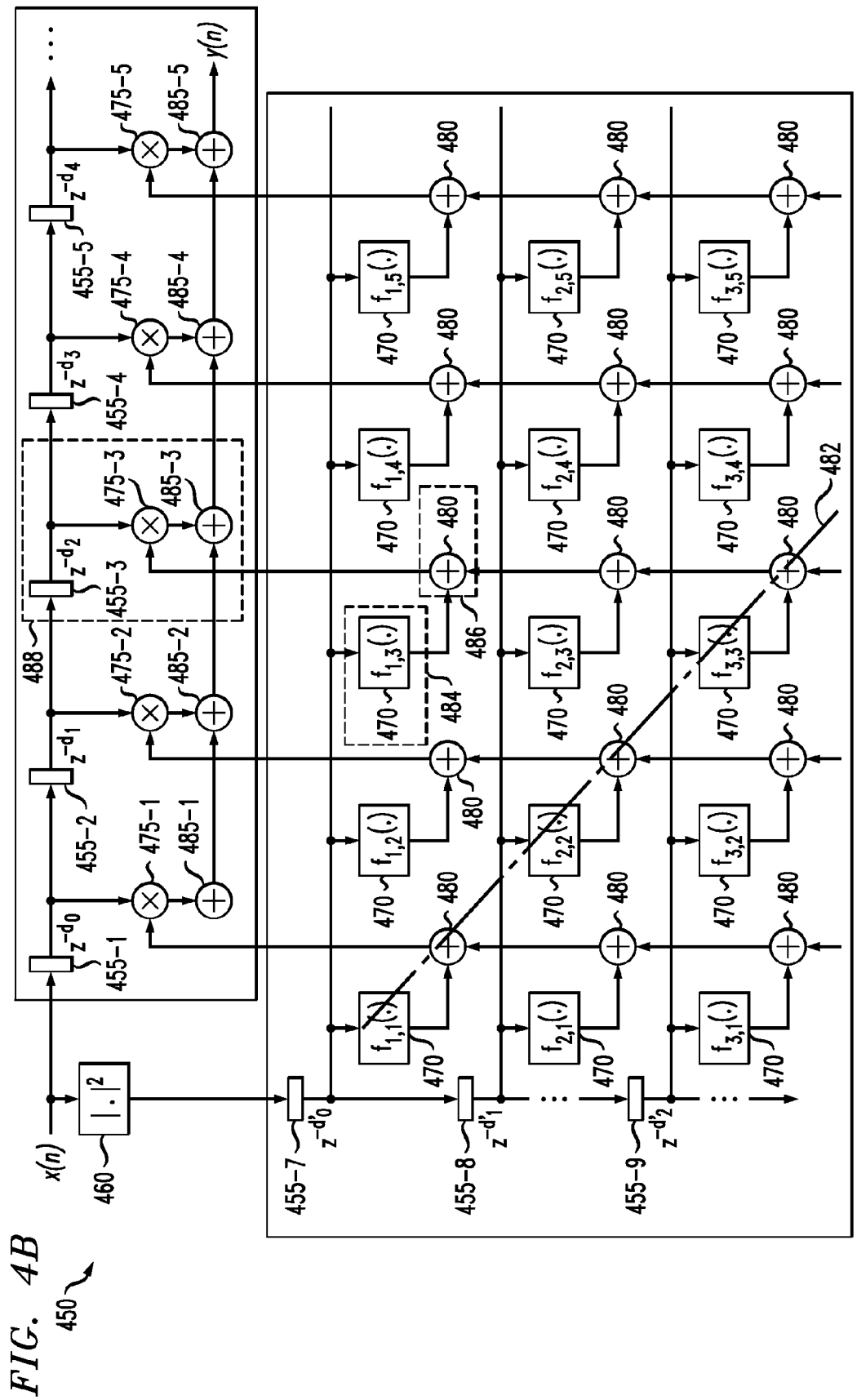

FIG. 4B provides a graphical illustration 450 of an alternate exemplary functional block diagram 450 that implements equation (3) with a reduced number of multiply operations. As shown in FIG. 4B, the exemplary circuit 450 comprises a plurality of delay elements, such as delay elements 455-1 through 455-5 to generate the x(n−m) term of equation (3) and delay elements 455-7 through 455-9 to generate the $|x(n-l)|^2$ term of equation (4) by delaying the output of a squaring operation 460. In addition, the exemplary functional block diagram 450 comprises an array of functional units 470-1,1 through 470-4,4 that receive the appropriate $|x(n-l)|^2$ Or term and implements equation (4). Adders 480 compute the non-linear gains (sum of non-linear functions of magnitude of the input).

The exemplary functional block diagram 450 also comprises a plurality of multipliers (x) 475 that receive the appropriate x(n−m) term and multiply it with the output of the summed output of a column of corresponding m,l functional units 470. In this manner, the non-linear gains from adders 480 are applied to the input data (complex multiply-accumulate (CMAC) operations). The outputs of the multiplication added by adders (+) 485 to generate the output y(n).

FIG. 4B also illustrates a diagonal line 482 that is discussed further below in conjunction with FIGS. 6-8.

Sliding Window Non-Linear Convolution Functions

As indicated above, aspects of the present invention recognize that the time shifted versions of input samples can be stored in a register and re-used multiple times in a single cycle, rather than reloading the input values from memory multiple times. Similarly, a given functional unit 470 of the exemplary functional block diagram 450 of FIG. 4B, such as the exemplary functional unit highlighted using a dashed box 484, and the associated exemplary delay, multiplier and adder circuitry highlighted using dashed boxes 486 and 488, are applied to 16 consecutive samples in a single cycle in the exemplary embodiment.

As discussed hereinafter, aspects of the present invention recognize that performance can be further improved relative to the implementations of FIGS. 4A and 4B by providing a sliding window non-linear convolution instruction, where a subset of the functional units are processed for each of multiple iterations. For example, one row, column or diagonal (four functional units) of the Generalized Memory Polynomial (GMP) matrix of FIGS. 4A and 4B can be processed in each of four iterations. While it takes multiple iterations to process the complete GMP matrix 400, 450, each cycle computes N outputs with a reduced number of memory accesses, relative to the embodiments of FIGS. 4A and 4B. The coefficients for the n×m functional units that are active in a given iteration are loaded from one or more look-up tables (LUTs).

Figure 5:
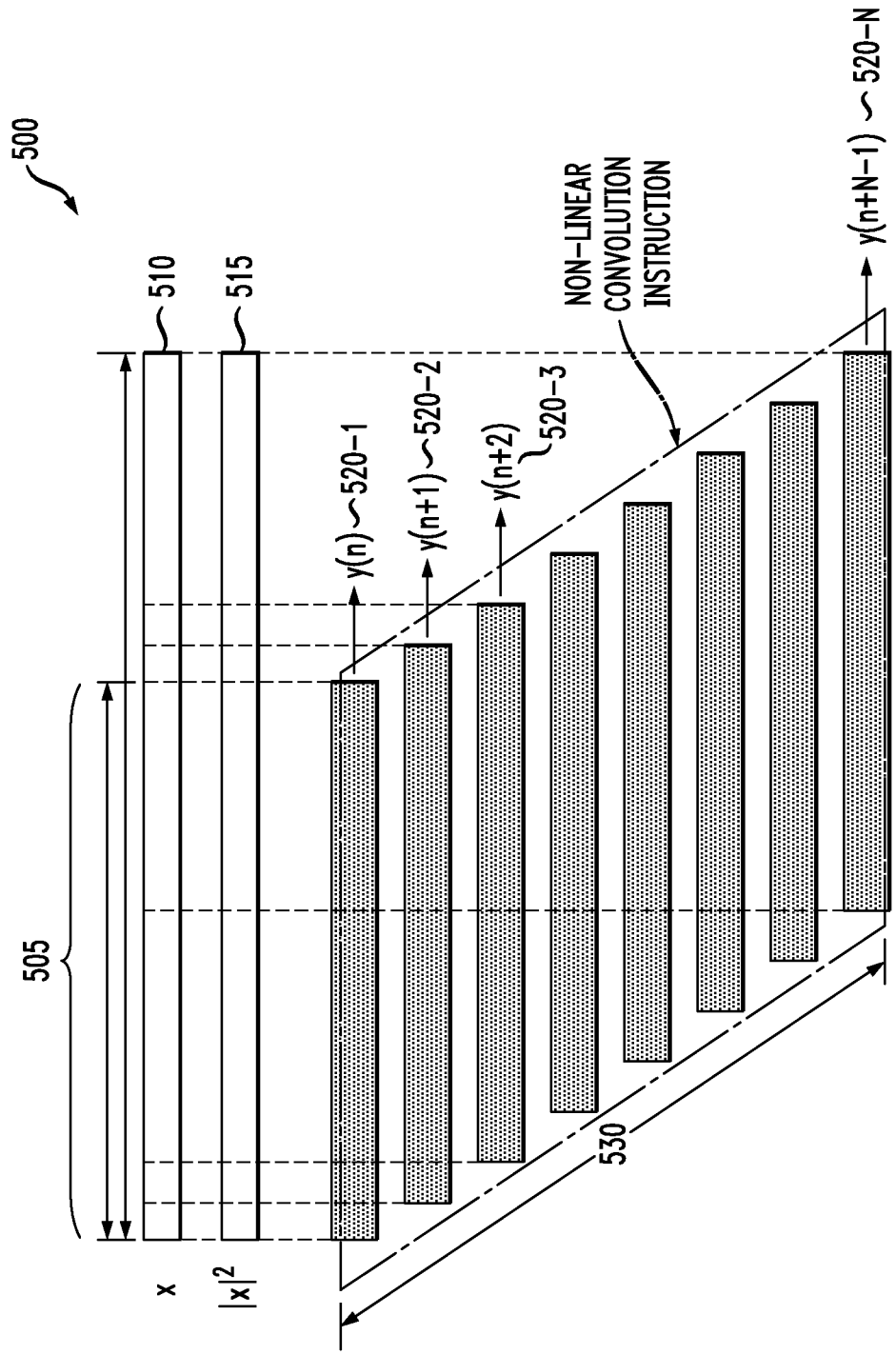
FIG. 5 illustrates a sliding window non-linear convolution function that incorporates features of the present invention.

FIG. 5 illustrates an exemplary non-linear convolution function 500 that incorporates features of the present invention. The exemplary non-linear convolution function 500 implements equation (1). Generally, the exemplary non-linear convolution function 500 computes the non-linear convolution of input data samples 510. M+N−1 input data samples 510 are needed to produce N output samples 520 N at a time by the vector processor 200. The exemplary non-linear convolution function 500 processes the input samples in chunks 505 corresponding to the memory depth M of the digital pre-distorter (DPD) or other non-linear system.

The non-linear convolution function 500 typically receives the input data samples 510 and processes time shifted versions of the input data samples 510, the "magnitude squared" versions 515 of the input data samples 510 and coefficients. For each time shifted-version (each time lag) along axis 530, the exemplary non-linear convolution function 500 produces an output value 520 in accordance with equation (1).

In the exemplary embodiment of FIG. 5, the input vector 510 comprises N1+N2-1 samples of real or complex data (e.g., 32-bit real and 32-bit imaginary) and there N2 time shifted versions 220 having N1 samples (16-bit real and 16-bit imaginary) that get convoluted with the coefficients. The coefficients can each be binary values (e.g., or 2 bit, 4 bit, etc).

It is noted that FIG. 5 illustrates the case where L=M. In the general case where L and M are different, M+N−1 samples of x, and L+N−1 samples of $|x|^2$ are needed. It is noted that L indicates the number of rows in the arrays of FIGS. 4 and 5 and M indicates the number of columns in the array.

Figure 6:
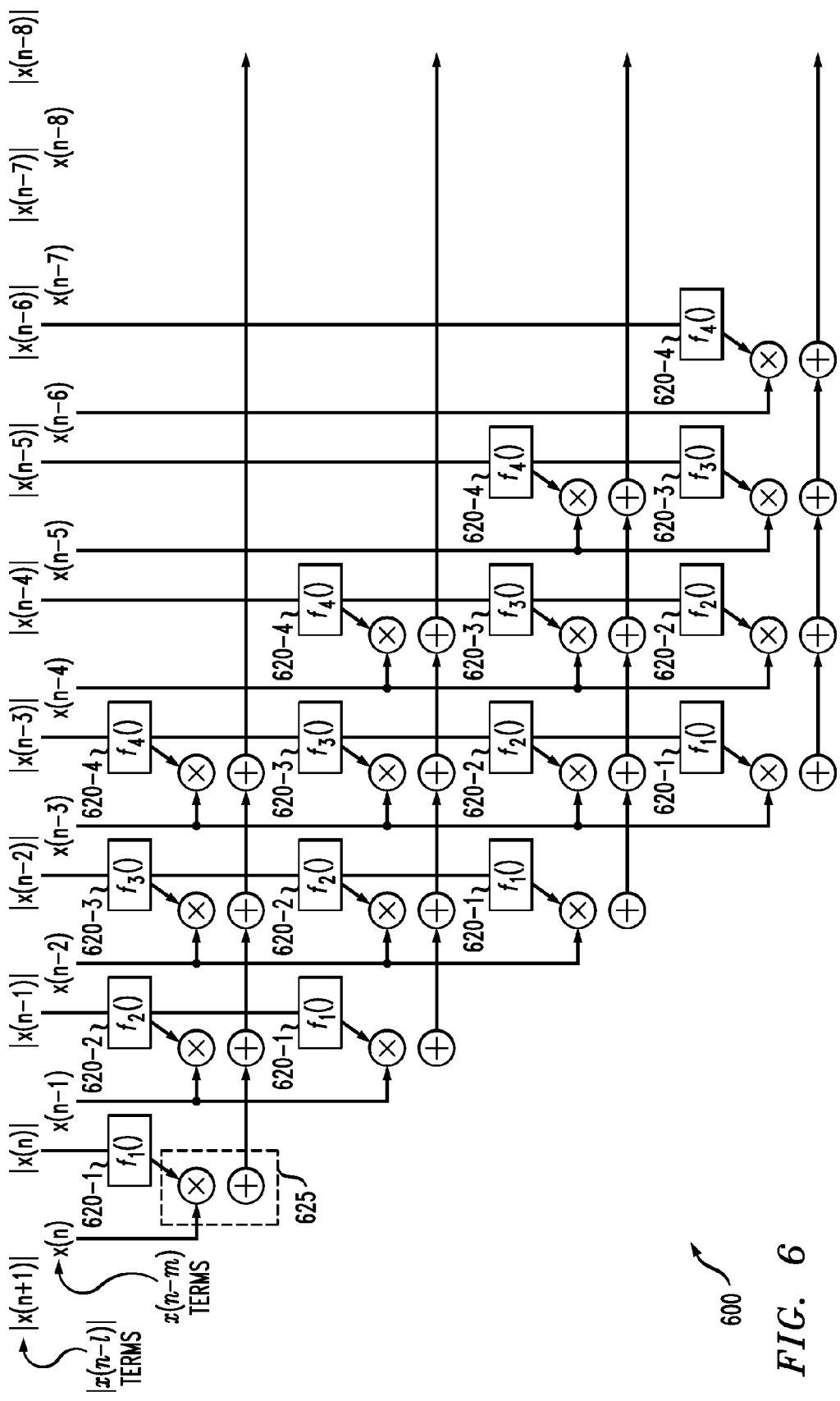
FIGS. 6 through 8 are graphical illustrations of exemplary functional block diagrams that compute diagonal terms, lower diagonal terms and upper diagonal terms, respectively.

FIG. 6 is a graphical illustration of an exemplary functional block diagram 600 that computes the diagonal terms of equation (3) associated with line 442 of FIG. 4A using matrix operations (n×m functional units at once). Thus, the exemplary functional block diagram 600 comprises functional units associated with the diagonal line 442 of FIG. 4A. The exemplary embodiment processes diagonal, lower diagonal and upper diagonal terms. It is noted, however, that in practice the matrix may be sparse and the non-linear polynomials that are grouped do not have to follow a diagonal, row or column pattern but may be comprised of any group from the larger set of polynomials.

The exemplary embodiment of FIG. 6 recognizes that the GMP matrix is a sparse matrix where the non-zero terms are near the diagonal. In further exemplary variations, the selected sub-set of functional units that are processed in a given iteration can be associated with a given row or column. The exemplary functional block diagram 600 corresponds to one diagonal slice of the sliding window non-linear convolution function out of a total three diagonal, upper diagonal and lower diagonal slices.

The exemplary circuit 600 comprises a plurality of delay elements (not shown) to generate the x(n−m) terms of equation (3) and delay elements (not shown) to generate the $|x(n-l)|$ term of equation (4). In addition, the exemplary functional block diagram 600 comprises a plurality of functional units $f_1(\ )$ through $f_4(\ )$ 620-1 through 620-4 that receive the appropriate $|x(n-l)|$ term and implement equation (4). The exemplary functional block diagram 600 also comprises exemplary circuitry 625 comprising a multiplier and an adder. The multipliers (x) in each circuit 625 receives the appropriate x(n−m) term and multiply it with the output of the corresponding functional unit $f_1(\ )$ through $f_4(\ )$ 620-1 through 620-4. The outputs of the multiplication in each row are added by the adder in the circuit 625 and the outputs of each adder in a given row are summed to generate the diagonal terms of the output y(n).

Aspects of the present invention thus recognize that the time shifted versions of input samples can be stored and re-used multiple times in a single cycle, rather than reloading the input values from memory multiple times. For example, as shown in FIG. 6, the time-shifted sample x(n−3) is applied to four different multipliers and can be re-used four times.

In the exemplary embodiment of FIG. 6, there are M=4 different look-up tables (columns) and N=4 different outputs (rows) per clock cycle. As shown in FIG. 6, each successive iteration is time-shifted by one. Thus, the second row, for example, computes the second output.

Figure 7:
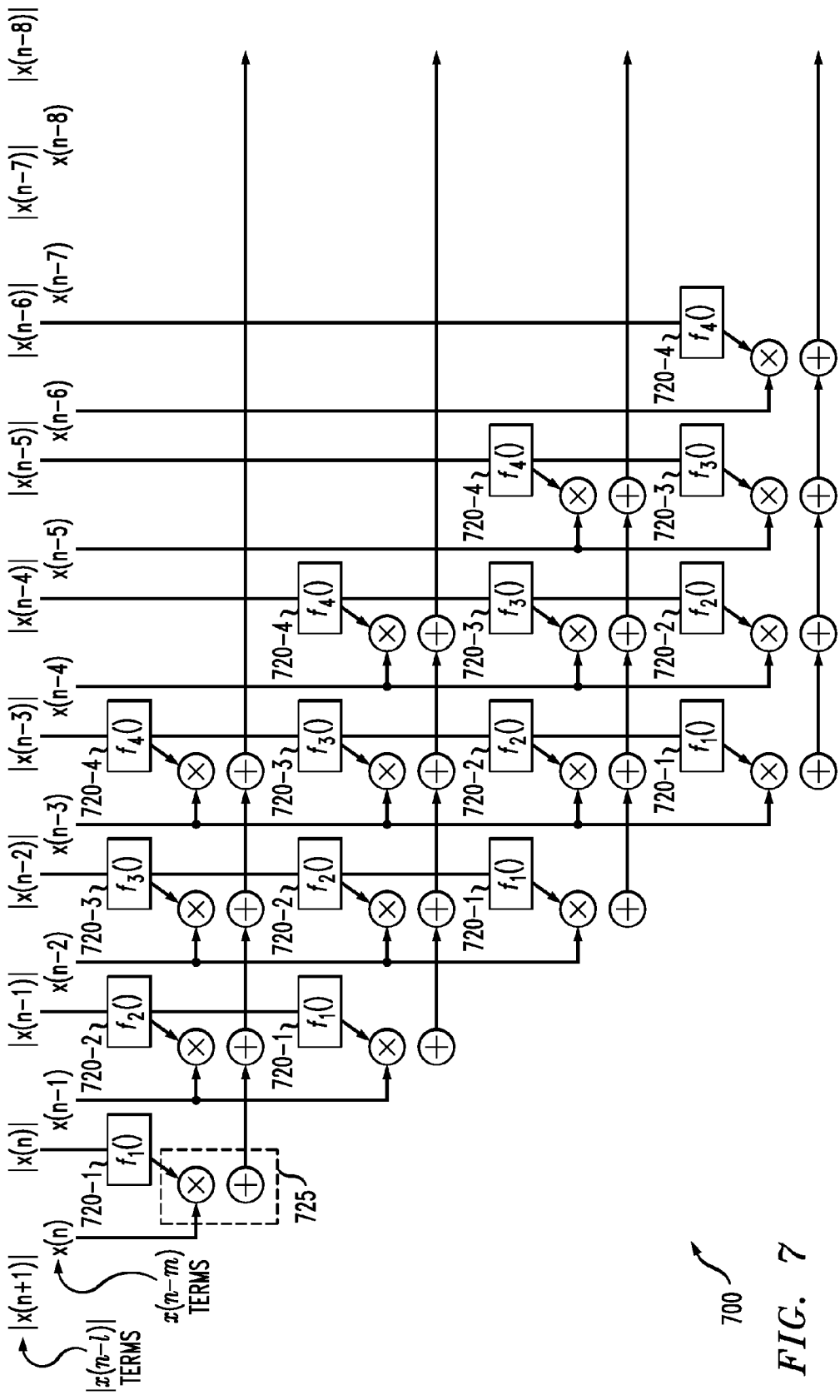

FIG. 7 is a graphical illustration of an exemplary functional block diagram 700 that computes the lower diagonal terms of equation (3) associated with diagonal line 442 (FIG. 4A) using matrix operations (n×m functional units at once). The lower diagonal terms are shifted down by one relative to the diagonal line 442 (FIG. 4A).

Generally, the exemplary functional block diagram 700 of FIG. 7 receives the same inputs as the exemplary functional block diagram 600 of FIG. 6, time shifted by one. Thus, the exemplary circuit 700 comprises a plurality of delay elements (not shown) to generate the x(n−m) terms of equation (3) and delay elements (not shown) to generate the |x(n−l)| term of equation (4). In addition, the exemplary functional block diagram 700 comprises a plurality of functional units $f_1(\ )$ through $f_4(\ )$ 720-1 through 720-4 that receive the appropriate |x(n−l)| term and implement equation (4). The exemplary functional block diagram 700 also comprises exemplary circuitry 725 comprising a multiplier and an adder. The multipliers (x) in each circuit 725 receives the appropriate x(n−m) term and multiply it with the output of the corresponding functional unit $f_1(\ )$ through $f_4(\ )$ 720-1 through 720-4. The outputs of the multiplication in each row are added by the adder in the circuit 725 and the outputs of each adder in a given row are summed to generate the lower diagonal terms of the output y(n).

Figure 8:
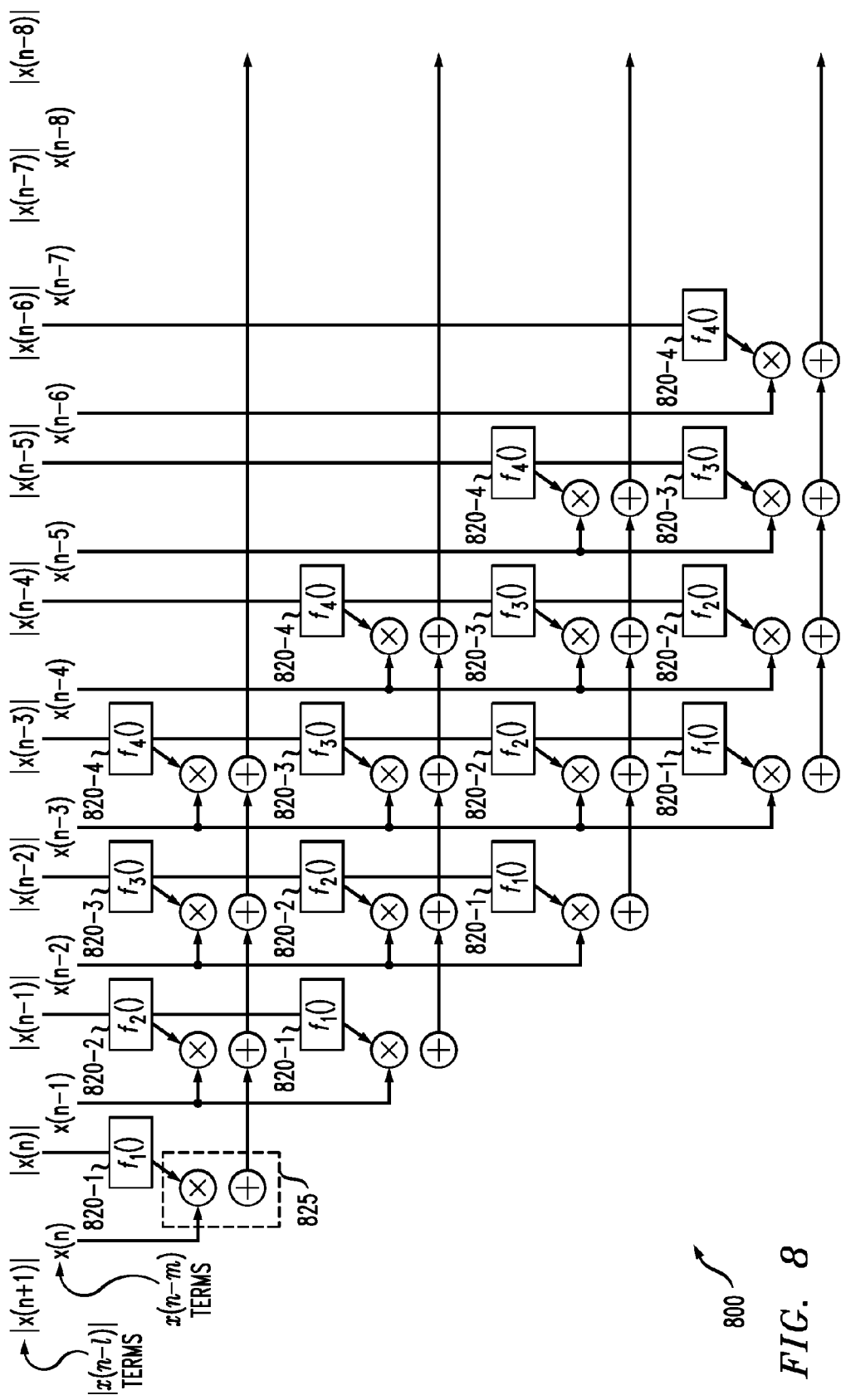

FIG. 8 is a graphical illustration of an exemplary functional block diagram 800 that computes the upper diagonal terms of equation (3) associated with diagonal line 442 (FIG. 4A) using matrix operations (n×m functional units at once). The upper diagonal terms are shifted up by one relative to the diagonal line 442 (FIG. 4A).

Generally, the exemplary functional block diagram 800 of FIG. 8 receives the same inputs as the exemplary functional block diagram 600 of FIG. 6, time shifted by two. Thus, the exemplary circuit 800 comprises a plurality of delay elements (not shown) to generate the x(n−m) terms of equation (3) and delay elements (not shown) to generate the |x(n−l)| term of equation (4). In addition, the exemplary functional block diagram 800 comprises a plurality of functional units $f_1(\ )$ through $f_4(\ )$ 820-1 through 820-4 that receive the appropriate |x(n−l)| term and implement equation (4). The exemplary functional block diagram 800 also comprises exemplary circuitry 825 comprising a multiplier and an adder. The multipliers (x) in each circuit 825 receives the appropriate x(n−m) term and multiply it with the output of the corresponding functional unit $f_1(\ )$ through $f_4(\ )$ 820-1 through 820-4. The outputs of the multiplication in each row are added by the adder in the circuit 825 and the outputs of each adder in a given row are summed to generate the upper diagonal terms of the output y(n).

The outputs of the exemplary functional block diagrams 600, 700, 800 of FIGS. 6-8 are accumulated to generate the final output y(n).

Figure 9:
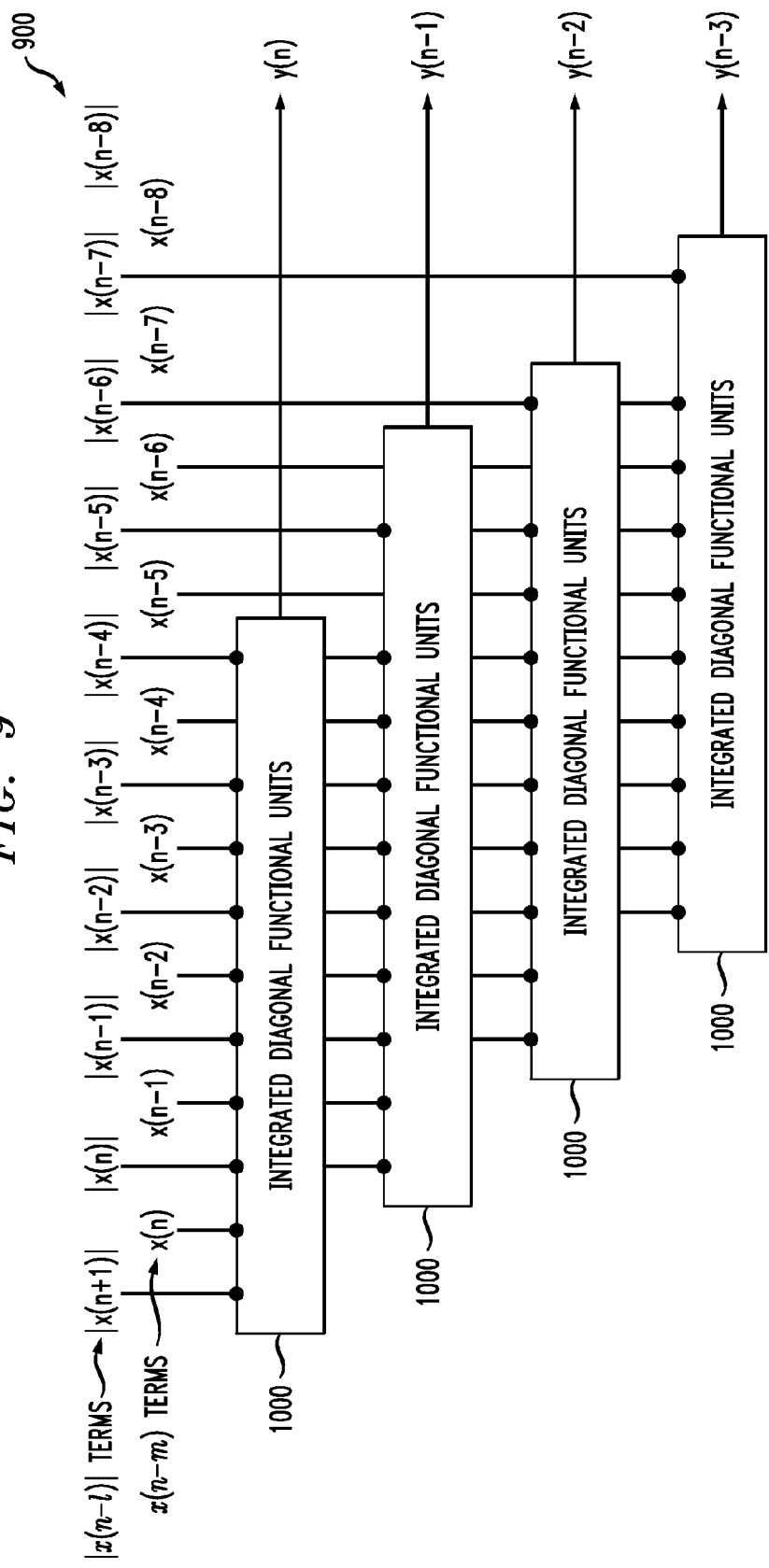
FIG. 9 is a graphical illustration of an exemplary functional block diagram that computes the diagonal, upper diagonal and lower diagonal terms in a single instruction call.

FIG. 9 is a graphical illustration of an exemplary functional block diagram 900 that computes the diagonal, upper diagonal and lower diagonal terms of equation (3) in a single instruction call. The exemplary circuit 900 comprises a plurality of delay elements (not shown) to generate the x(n−m) terms of equation (3) and delay elements (not shown) to generate the |x(n−l)| term of equation (4). In addition, the exemplary functional block diagram 900 comprises a plurality of integrated diagonal functional units 1000, as discussed further below in conjunction with FIG. 10, that each generate one output, y, in a single cycle.

For an exemplary 4×4 matrix that processes diagonal, upper diagonal and lower diagonal terms, there are 3×M×N LUTs, M×N adders and M×N MACs. There are 3×N table inputs (e.g., M=8→24 different tables).

Figure 10:
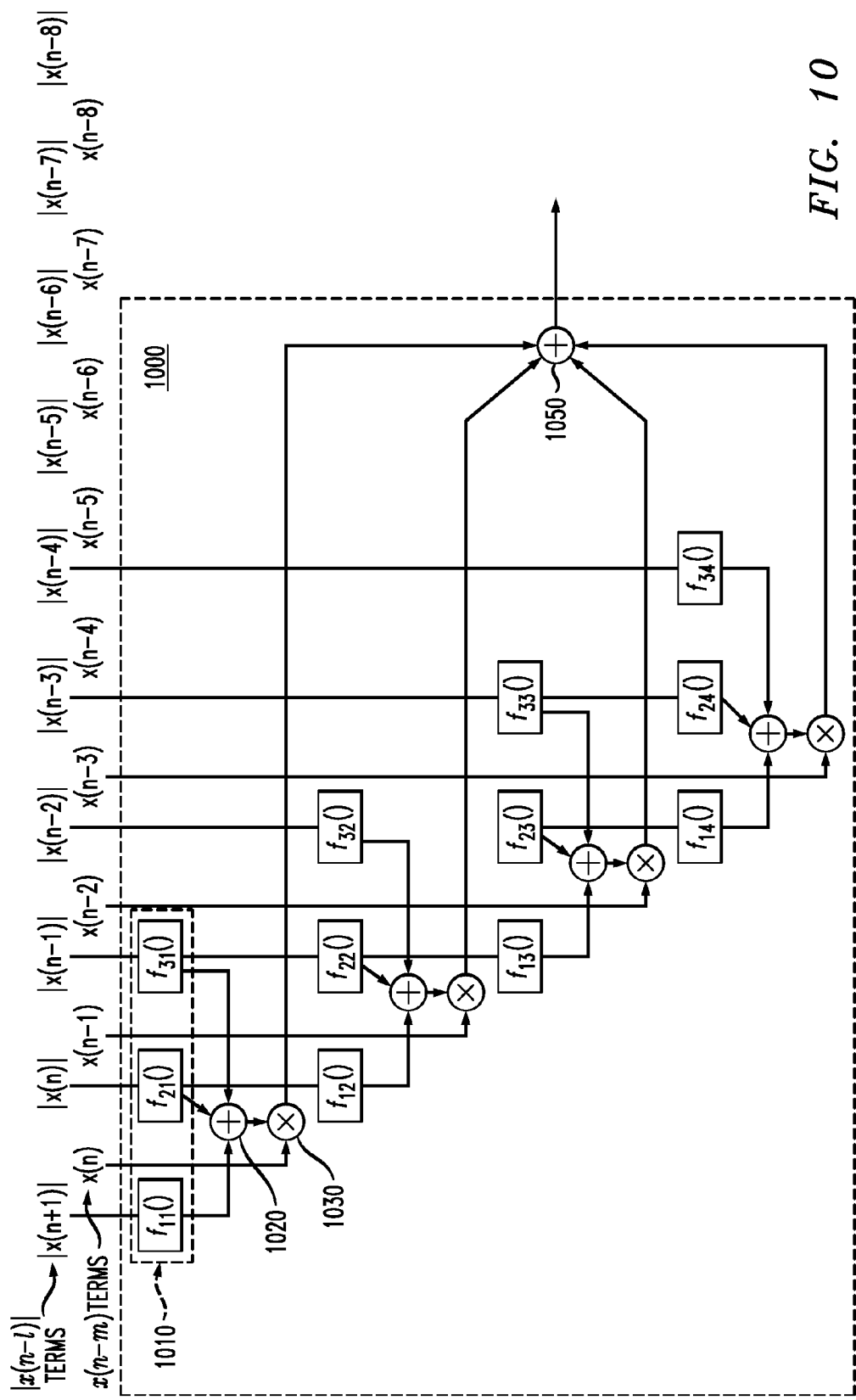
FIG. 10 is a graphical illustration of an exemplary integrated diagonal functional unit of FIG. 9 in further detail.

FIG. 10 is a graphical illustration of an exemplary integrated diagonal functional unit 1000 of FIG. 9 in further detail. As shown in FIG. 10, the exemplary integrated diagonal functional unit 1000 comprises a plurality of delay elements (not shown) to generate the x(n−m) terms of equation (3) and delay elements (not shown) to generate the |x(n−l)| term of equation (4). The exemplary integrated diagonal functional unit 1000 generates one output, y, in a single cycle.

The functional units in a given row of the integrated diagonal functional unit 1000, such as the three functional units 1010 in the first row, correspond to the diagonal, upper diagonal and lower diagonal terms. The functional units in a given row of the integrated diagonal functional unit 1000, such as the three functional units 1010 in the first row, receive the appropriate |x(n−l)| term and implement equation (4).

In addition, the output of each functional unit in a given row of the integrated diagonal functional unit 1000, such as the output of the three functional units 1010 in the first row, are summed by a first adder 1020. The summed output of adder 1020 is applied to a multiplier 1030. The multiplier 1030 receives the appropriate x(n−m) term and multiplies it with the summed output of the adder 1020. The outputs of the multiplication in each row are added by an adder 1050 that generates the output y(n). The output y(n) comprises one slice of the sliding window non-linear convolution function (out of four slices).

An exemplary implementation employing M=8 columns by N=8 rows of functional units provides a symmetrical structure. An alternate embodiment of the invention recognizes that an asymmetrical structure may optimize memory bandwidth in certain situations. FIG. 11 illustrates an alternate asymmetric embodiment of the invention, where the exemplary input 1110 comprising a 2×4 matrix is processed by an asymmetric 4×16 array 1130 of functional units, and the output 1120 comprises a 4 element vector, using a plurality of overlapping windows 1150. In further implementations, it may be beneficial to have the asymmetry with N greater than M, depending on the use case.

The embodiments employing asymmetrical structures recognize that an 8×8 convolution may not be optimized for a 16-way single instruction, multiple data (SIMD) operation. Thus, the exemplary embodiment of FIG. 11 employs a 4-way SIMD type of architecture to reduce base processor complexity.

CONCLUSION

While exemplary embodiments of the present invention have been described with respect to digital logic blocks and memory tables within a digital processor, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit or micro-controller. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, wherein, when the program code is loaded into and executed by a machine, such as a processor, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital processor, a microprocessor, and a micro-controller.

It is to be understood that the embodiments and variations shown and described herein are merely illustrative of the principles of this invention and that various modifications may be implemented by those skilled in the art without departing from the scope and spirit of the invention.

We claim:

1. A method performed by a processor, comprising:
   obtaining at least one software instruction that performs at least one non-linear convolution function for a plurality of input delayed signal samples;
   in response to said at least one software instruction for said at least one non-linear convolution function, performing the following steps:
   generating a weighted sum of two or more of said input delayed signal samples, wherein said weighted sum comprises a plurality of variable coefficients defined as a sum of one or more non-linear functions of a magnitude of said input delayed signal samples; and
   repeating said generating step for at least one time-shifted version of said input delayed signal samples to compute a plurality of consecutive outputs, wherein said at least one software instruction for said at least one non-linear convolution function is part of an instruction set of said processor.

2. The method of claim 1, wherein said processor comprises a vector processor.

3. The method of claim 1, wherein said plurality of variable coefficients defined by a non-linear function of a magnitude of said input delayed signal samples are implemented using one or more look-up tables.

4. The method of claim 1, wherein said non-linear convolution function models a non-linear system with memory.

5. The method of claim 4, wherein said non-linear system with memory comprises one or more of a power amplifier model and a digital pre-distortion function.

6. The method of claim 1, wherein said at least one non-linear convolution function is implemented using one or more look-up tables having linear interpolation.

7. The method of claim 1, wherein said at least one non-linear convolution function is implemented using one or more look-up tables having polynomial interpolation.

8. The method of claim 1, further comprising the step of loading at least one user-specified parameter from memory into at least one register file.

9. The method of claim 8, wherein said user-specified parameter comprises a look-up table storing values of said non-linear convolution function for one or more input values.

10. The method of claim 1, further comprising the step of reading said plurality of input delayed signal samples directly from memory into functional units for said non-linear convolution function.

11. A processor configured to implement a signal processing function in software, comprising:
    a memory; and
    at least one hardware device, coupled to the memory, operative to:
    obtain at least one software instruction that performs at least one non-linear convolution function for a plurality of input delayed signal samples;
    in response to said at least one software instruction for said at least one non-linear convolution function:
    generate a weighted sum of two or more of said input delayed signal samples, wherein said weighted sum comprises a plurality of variable coefficients defined as a sum of one or more non-linear functions of a magnitude of said input delayed signal samples; and
    repeat said generating step for at least one time-shifted version of said input delayed signal samples to compute a plurality of consecutive outputs, wherein said at least one software instruction for said at least one non-linear convolution function is part of an instruction set of said processor.

12. The processor of claim 11, wherein said processor comprises a vector processor.

13. The processor of claim 11, wherein said plurality of variable coefficients defined by a non-linear function of a magnitude of said input delayed signal samples are implemented using one or more look-up tables.

14. The processor of claim 11, wherein said non-linear convolution function models a non-linear system with memory.

15. The processor of claim 14, wherein said non-linear system with memory comprises one or more of a power amplifier model and a digital pre-distortion function.

16. The processor of claim 11, wherein said at least one non-linear convolution function is implemented using one or more look-up tables having linear interpolation.

17. The processor of claim 11, wherein said at least one non-linear convolution function is implemented using one or more look-up tables having polynomial interpolation.

18. The processor of claim 11, further comprising the step of loading at least one user-specified parameter from memory into at least one register file.

19. The processor of claim 18, wherein said user-specified parameter comprises a look-up table storing values of said non-linear convolution function for one or more input values.

20. The processor of claim 11, further comprising the step of reading said plurality of input delayed signal samples directly from memory into functional units for said non-linear convolution function.

21. An article of manufacture, comprising a non-transitory machine readable recordable medium containing one or more programs which when executed by a processor implement the steps of:
    obtaining at least one software instruction that performs at least one non-linear convolution function for a plurality of input delayed signal samples;
    in response to said at least one software instruction for said at least one non-linear convolution function, performing the following steps:
    generating a weighted sum of two or more of said input delayed signal samples, wherein said weighted sum comprises a plurality of variable coefficients defined as a sum of one or more non-linear functions of a magnitude of said input delayed signal samples; and
    repeating said generating step for at least one time-shifted version of said input delayed signal samples to compute a plurality of consecutive outputs, wherein said at least one software instruction for said at least one non-linear convolution function is part of an instruction set of said processor.

* * * * *